US012781334B2

(12) United States Patent
Chuang

(10) Patent No.: US 12,781,334 B2
(45) Date of Patent: Nov. 3, 2026

(54) NANO-TWINNED ULTRA-THIN METALLIC FILM STRUCTURE AND METHODS FOR FORMING THE SAME

(71) Applicant: AG MATERIALS TECHNOLOGY CO., LTD., Hsinchu City (TW)

(72) Inventor: Chien-Hsun Chuang, Hsinchu City (TW)

(73) Assignee: AG MATERIALS TECHNOLOGY CO., LTD., Hsinchu City (TW)

( * ) Notice: Subject to any disclaimer, the term of this patent is extended or adjusted under 35 U.S.C. 154(b) by 700 days.

(21) Appl. No.: 18/192,991

(22) Filed: Mar. 30, 2023

(65) Prior Publication Data

US 2024/0158907 A1 May 16, 2024

(30) Foreign Application Priority Data

Nov. 15, 2022 (TW) .................................. 111143506

(51) Int. Cl.
*C23C 14/16* (2006.01)
*B32B 15/02* (2006.01)
*C23C 14/46* (2006.01)

(52) U.S. Cl.
CPC ............ *C23C 14/165* (2013.01); *C23C 14/46* (2013.01)

(58) Field of Classification Search
CPC ........ B32B 15/02; C23C 14/165; C23C 14/46
USPC .......................................................... 428/699
See application file for complete search history.

(56) References Cited

U.S. PATENT DOCUMENTS

2013/0122326 A1* 5/2013 Chen ........................ C25D 5/08 205/291
2021/0020599 A1* 1/2021 Chen ........................ H01L 24/83
2022/0388092 A1* 12/2022 Chuang .................. B23K 20/16

* cited by examiner

*Primary Examiner* — Katherine A Christy

(57) ABSTRACT

The nano-twinned ultra-thin metallic film structure includes a substrate and a nano-twinned metallic thin film on the surface of the substrate. The nano-twinned metallic thin film has a thickness of 0.5 μm to 3 μm and includes silver, copper, gold, palladium or nickel. The nano-twinned metallic thin film has a transition layer near the substrate and a twin layer away from the substrate. The twin layer accounts for at least 70% of the thickness of the nano-twinned metallic thin film and has parallel-arranged twin boundaries. The parallel-arranged twin boundaries include more than 50% (111) crystal orientation. The nano-twinned ultra-thin metallic film structure is formed by activating the substrate surface using ion beam bombardment, followed by performing a sputtering process on the activated substrate surface with a substrate bias.

11 Claims, 10 Drawing Sheets

NANO-TWINNED ULTRA-THIN METALLIC FILM STRUCTURE AND METHODS FOR FORMING THE SAME

CROSS REFERENCE TO RELATED APPLICATIONS

This application claims priority of Taiwan Patent Application No. 111143506, filed on Nov. 15, 2022, the entirety of which is incorporated by reference herein.

BACKGROUND OF THE INVENTION

Field of the Invention

The present disclosure relates to a metallic thin film structure and a method for forming the same, and, in particular, to a nano-twinned ultra-thin metallic film structure (no more than 3 μm) and a method for forming the same.

Description of the Related Art

Most conventional metallic thin film structures are equiaxial grains with grain sizes of several microns or more. U.S. Patent Publication No. US20150275350A1 discloses a structure of silver or silver alloy nano-twinned thin film sputtered directly on a silicon substrate. The silver or silver alloy nano-twinned thin film has better tensile strength and conductivity than ordinary grains or nano equiaxial grains. However, the silver or silver alloy nano-twinned density is less than 30%.

Taiwan Patent No. 1703226 discloses a structure of silver nano-twinned thin film sputtered and evaporated on the surface of a silicon chip. However, the thickness of the nano-twinned region is no more than 70% of the overall thickness of the metallic thin film, and the remaining region is the transition layer with disordered grains. When the thickness of the metallic thin film is less than 2 almost the entire metallic thin film is disordered grains. In other words, it is impossible to form a metallic thin film that is thinner than 2 μm with a nano-twinned region that represents more than 70% of the thickness of the metallic thin film. In 3D-IC advanced packaging of hybrid bonding chips, an electrical connecting layer less than 1 μm thick is required. Therefore, the electroplated copper thin film with nano-twinned region of high density of (111) preferred crystal orientation disclosed in Taiwan Patent No. 16865724 has great challenges in low temperature bonding efficacy, and may be completely unsuitable for use in 3D-IC advanced packaging of hybrid bonding chips. In addition, Taiwan patent No. 1703226 only discloses the method of sputtering and evaporation of silver nano-twinned film structure and does not disclose the formation of high-density nano-twinned thin film structure of copper, gold, palladium, or nickel.

Taiwan Patent No. 1419985 discloses the electroplating of silver, copper, gold or nickel thin film on a silicon oxide substrate. The metallic thin film formed by the electroplating is then bombarded with ions to form mechanical twins. However, the distance between twin boundaries is between 8.3 nm and 45.6 nm, and the distribution of crystal orientation is disordered. A large number of parallel-arranged nano twins cannot be formed by the method disclosed in No. 1419985. Also, the nano-twinned density is also less than 50%.

Taiwan Patent No. 1432613 discloses a method for electroplating a copper nano-twinned thin film. Taiwan Patent No. 1521104 discloses a method for electroplating a copper seed layer and then electroplating nickel nano-twinned thin film. Taiwan Patent No. 1507548 discloses a method for electroplating a gold nano-twinned thin film. Although these conventional techniques can form a large number of parallel distributed nano-twins on the substrate, they all use high-speed rotary plating method with a speed of 50 rpm or even 1500 rpm. It is difficult to control the process and film quality, and the distance between the twin boundaries is relatively large. The (111) preferred crystal orientation of the surface grains in the thin film formed by these techniques is usually less than 50%. Taiwan patent No. 1432613 shows that the X-ray diffraction (XRD) of the thin film still has obvious Cu (222) crystal orientation, and the Taiwan patent No. 1507548 shows a more obvious Au (222) crystal orientation of the thin film in XRD image, and the (111) preferred crystal orientation in the thin film is even far below 50%. In particular, the size of components or contacts in the electroplating process will be limited. Generally, components or contacts smaller than 2 μm cannot be produced by electroplating. Especially in the application of 3D-IC advanced packaging of hybrid bonding chips, when the thickness of the electroplated nano-twinned metallic thin films is less than 1 almost the entire metallic thin film presents as a disordered grain layer, that is, it is impossible to form a metallic thin film less than 1 μm and with a high-density nano-twinned region by electroplating. Therefore, the low-temperature bonding effect of the electroplated copper thin film with high-density nano-twinned region of (111) preferred crystal orientation disclosed in Taiwan patent No. 16865724 cannot be actually applied in the 3D-IC advanced packaging of hybrid bond crystal wafer.

Taiwan Patent Application No. 100136726 discloses a method of applying ion beam bombardment to the surface of the thin film after electroplating, which can form nano-twinned region in thin film less than 1 μm. However, the (111) preferred crystal orientation of the surface grains in the thin film is less than 50%, and the thin film needs to be cooled down to below −20° C., so a complex cooling device is required. In addition, the voltage of the ion beam bombardment is as high as 4000V to 5000V, which often causes partial melting of the thin film. Besides, the electroplating process requires high speed rotation and stirring, which makes it difficult to control the forming process and the quality of the thin film, and there are also environmental concerns surrounding electroplating waste.

Taiwan patent No. 1703226 discloses a method for sputtering or vapor-depositing silver nano-twinned films, which does not apply ion beam bombardment to the substrate, nor applies ion beam bombardment in the sputtering or vapor deposition process simultaneously, so only a high-density nano-twinned structure can be formed in silver films with high stacking energy. For other metal films with low stacking energy, such as copper, nickel, gold, palladium, etc., the (111) preferred crystal orientation of the grains on the surface of the film is far lower than 50%. Even when the thickness of the sputtered or evaporated silver nano-twinned thin film is less than 1 the thin film mostly present as coarse grains with disordered crystal orientation, which limits the application of the thin film in 3D-IC hybrid bonding.

Obviously, there are still many shortcomings in the conventional nano-twinned metallic thin film formation technology. Therefore, there are still many challenges for the application of nano-twinned thin films in the low-temperature die bonding of semiconductor chips with ceramic substrates, and the low-temperature direct bonding of 3D-IC chips or wafers.

BRIEF SUMMARY OF THE INVENTION

An embodiment of the present invention provides a nano-twinned ultra-thin metallic film structure, which includes a substrate and a nano-twinned metallic thin film on the surface of the substrate. The thickness of the nano-twinned metallic thin film is 0.5 μm to 3 μm, the nano-twinned metallic thin film includes a transition layer near the substrate and a twin layer away from the substrate, the twin layer accounts for at least 70% of the thickness of the nano-twinned metallic thin film and includes parallel-arranged twin boundaries, and the parallel-arranged twin boundaries include no less than 50% of (111) crystal orientation. The nano-twinned metallic thin film includes silver, copper, gold, palladium, or nickel.

An embodiment of the present invention provides a method of forming a nano-twinned ultra-thin metallic film structure. The method includes activating the surface of a substrate using ion beam bombardment and forming a nano-twinned metallic thin film on the activated surface of the substrate. The thickness of the nano-twinned metallic thin film is 0.5 μm to 3 μm, the nano-twinned metallic thin film includes a transition layer near the substrate and a twin layer away from the substrate, the twin layer accounts for at least 70% of the thickness of the nano-twinned metallic thin film and includes parallel-arranged twin boundaries, and the parallel-arranged twin boundaries include no less than 50% of (111) crystal orientation. The nano-twinned metallic thin film includes silver, copper, gold, palladium, or nickel.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION OF THE INVENTION

Figure 1:
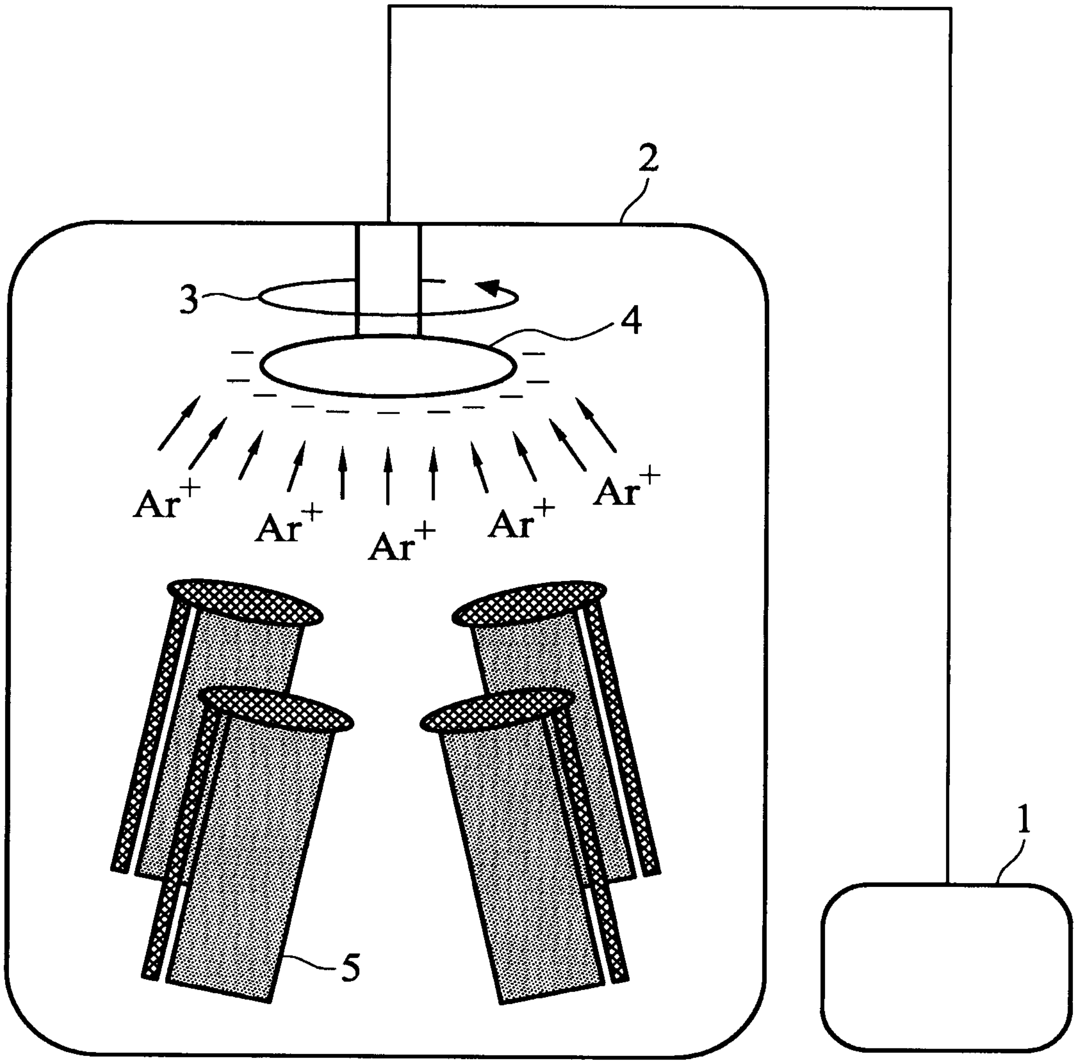
FIG. 1 shows the schematic diagram of the method of forming the nano-twinned ultra-thin metallic film structure, according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Some variations of embodiments are described below. In different figures and illustrated embodiments, similar element symbols are used to indicate similar elements. It is appreciated that additional operations can be provided before, during, and/or after the stages described in these embodiments. Some of the stages that are described can be replaced or eliminated for different embodiments.

Furthermore, spatially relative terms, such as "beneath," "below," "lower," "overlapped," "upper" and the like, may be used herein for ease of description to describe one element or feature's relationship to another element(s) or feature(s) as illustrated in the figures. The spatially relative terms are intended to encompass different orientation of the device in use or operation in addition to the orientation depicted in the figures. The apparatus may be otherwise oriented (rotated 90 degrees or at other orientation) and the spatially relative descriptors used herein may likewise be interpreted accordingly.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The term "substantially" in the description, such as in "substantially peeling" will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%.

In general, the lower the stacking fault energy of the metal material, the easier it is to form a twinned structure. The metal materials selected in the present disclosure all have relatively low stacking fault energy, such as silver (25 $mJ/m^2$), copper (70 $mJ/m^2$), gold (45 $mJ/m^2$), palladium (130 $mJ/m^2$) and nickel (225 $mJ/m^2$), which are all conducive to the formation of the nano-twinned structure. In addition, the resistivity of the metal materials selected in the present disclosure is also relatively low, such as silver (1.63 μΩ·cm), copper (1.69 μΩ·cm), gold (2.2 μΩ·cm), palladium (10.8 μΩ·cm) and nickel (6.90 μΩ·cm), and they can all provide excellent conductivity for three-dimensional integrated circuit (3D-IC) wafer packaging.

In addition to the characteristics of metal itself, the characteristics of the twin structure, such as better resistance to oxidation, resistance to corrosion, electrical conductivity, thermal conductivity, and high temperature stability, etc., make the nano-twinned ultra-thin metallic film provided by the embodiments of the present disclosure more applicable in the low-temperature die bonding of semiconductor chip with ceramic substrate, and in the low-temperature direct bonding of 3D-IC chips or wafers.

In the present disclosure, the surface of the substrate is activated by conducting the ion beams bombardment before forming the thin film, so that the density of dangling bonds on the surface of the substrate increases. Since the dangling bond is a high-energy reconstruction structure, it is beneficial for the metallic film subsequent formed on the wafer to obtain additional energy to overcome the stacking fault energy, thereby a twinned structure is formed. Therefore, in the present disclosure, the nano-twinned metallic thin film can be directly formed on the surface of the substrate without forming an adhesive layer on the substrate first.

According to some embodiments of the present disclosure, the nano-twinned metallic thin film in the nano-twinned ultra-thin metallic film structure of the present disclosure can be formed by sputtering. Referring to FIG. 1, first turn on the power supply 1 and use the vacuum pump to pre-evacuate the chamber 2 to the vacuum degree less than $6\times10^{-6}$ Torr (for example, $1\times10^{-8}$ Torr to $5\times10^{-6}$ Torr, $5\times10^{-8}$ Torr to $1\times10^{-6}$ Torr, $1\times10^{-7}$ Torr to $5\times10^{-7}$ Torr), and introduce 99.9%-99.999% high-purity argon gas, wherein the flow rate is adjust to 1 sccm-10 sccm (such as 3 sccm-7 sccm, 4.5 sccm-5.5 sccm) by a mass flow controller. Until the flow is stable, the pressure of the chamber is adjusted to the required pressure of $1\times10^{-5}$ Torr to $1\times10^{-3}$ Torr (such as $3\times10^{-5}$ Torr to $7\times10^{-4}$ Torr, $6\times10^{-5}$ Torr to $4\times10^{-4}$ Torr, $9\times10^{-5}$ Torr to $1.5\times10^{-4}$ Torr). Next, set the rotation speed of the stage (Holder) 3 to 5 rpm to 20 rpm (for example, 7 to 18 rpm, 9 to 16 rpm, and 11 to 14 rpm), and turn on the ion gun (not shown) to activate the sample 5. Afterwards, a bias voltage is applied to the sample 5, and the sample 5 is sputtered with the sputtering gun 4. The two procedures, the activation of the sample 5 and sputtering on the sample 5 with a bias voltage applied, are all carried out in the same equipment (FIG. 1) and in the same vacuum chamber.

Figure 2A:
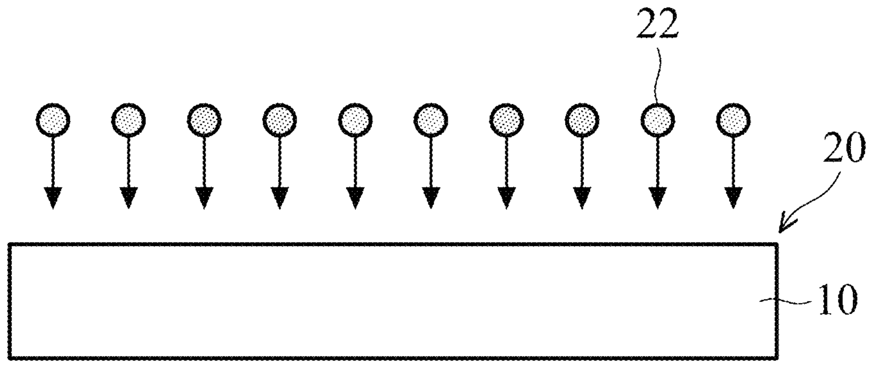
FIGS. 2A-2B show the schematic diagrams of the nano-twinned ultra-thin metallic film structure in various process stages, respectively, according to some embodiments of the present disclosure.
Figure 2B:
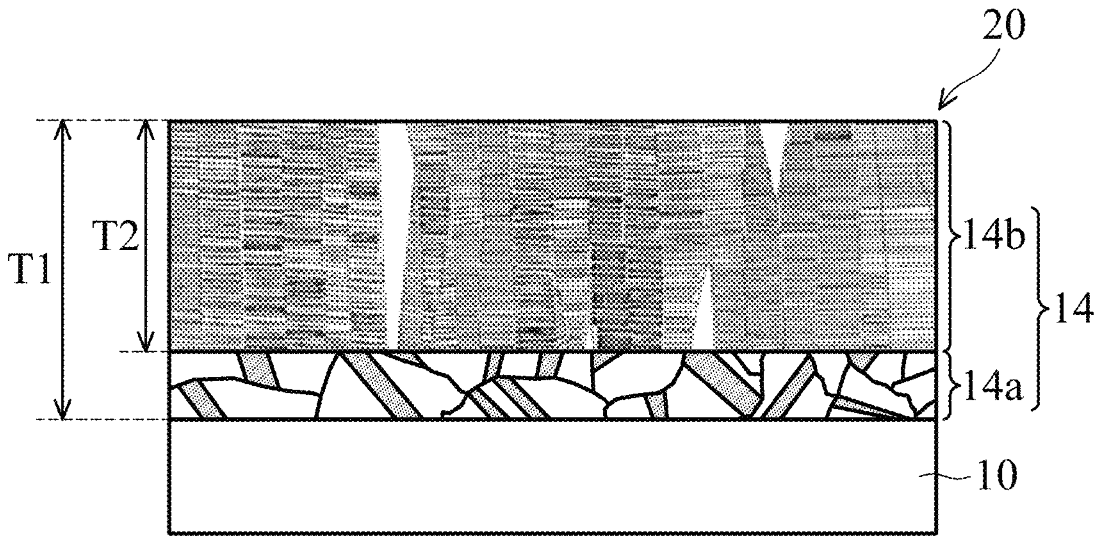

FIGS. 2A-2B show the schematic diagrams of the nano-twinned ultra-thin metallic film structure in various process stages, respectively, according to some embodiments of the present disclosure. Referring to FIG. 2A, first, the surface of the substrate 10 is activated (surface activated) by ion-beam bombarded 22. In some embodiments, the substrate 10 includes a silicon substrate, a silicon carbide substrate, a gallium arsenide substrate, a sapphire substrate, and a glass substrate. In some embodiments, a plurality of integrated circuit devices have been formed on the surface of the substrate 10, including active components such as diodes, field effect transistors, bipolar junction transistors, etc., passive elements such as resistors, capacitors, and inductors, etc., and the like. In some other embodiments, the substrate 10 is a bare wafer substrate without any active or passive components. In some embodiments, the power of the ion beam bombardment 22 is 20 W to 100 W, the ion beam bombardment 22 can use an argon ion beam or an oxygen ion beam, the voltage of the ion gun can be −200 V to −800 V, and duration of the bombardment is 10 minutes to 60 minutes.

Next, referring to FIG. 2B, a nano-twinned metallic thin film 14 is formed on the surface of the substrate 10 after activation. In the present disclosure, the nano-twinned metallic thin film 14 may be directly formed on the substrate 10 by sputtering. In some embodiments, the sputtering adopts single-gun sputtering or multi-gun co-sputtering. In the sputtering process, the power source may use, for example, DC, DC plus, RF, or high-power impulse magnetron sputtering (HIPIMS). The sputtering power of the nano-twinned metallic thin film 14 may be, for example, about 100 W to about 500 W. The temperature of the sputtering process is room temperature, but the temperature will rise by about 50° C. to about 200° C. during the sputtering process. The background pressure of the sputtering process is no more than $1\times10^{-5}$ Torr. The working pressure may be, for example, about $1\times10^{-3}$ Torr to about $1\times10^{-2}$ Torr. The flow rate of argon is about 10 sccm to about 20 sccm. The rotation speed of the holder may be, for example, about 5 rpm to about 20 rpm. It should be understood that, the parameters of the sputtering process described above may be appropriately adjusted according to practical applications, and the present disclosure is not limited thereto. The bias voltage applied to the substrate 10 during the sputtering process is about −100V to about −500V, such as −110V to −450V, −130V to −400V, −150V to −350V, −170V to −300V, or −200V to −250V. By utilizing the negative bias to attract argon ions to bombard the sputtered metal film, the ion impact energy is enough to overcome the stack fault energy of the metal, so that the nano-twinned metallic thin film 14 is formed. Thus, it can ensure that even the thickness of the nano-twinned metallic thin film 14 is less than 3 or even less than 1 more than 70% of the internal grain structure of the thin film is nano-twinned structure.

The nano-twinned metallic thin film 14 includes a transition layer 14*a* close to the substrate 10, and a twin layer 14*b* away from the substrate 10. As shown in FIG. 2B, the nano-twinned metallic thin film 14 has a thickness of T1, twin layer 14*b* of the film 14 has a thickness of T2, and the transition layer 14*a* of the film 14 has a thickness that is approximately equal to the difference between T1 and T2. In some embodiments, the thickness T1 of the nano-twinned metallic thin film 14 is 0.5 μm to 3 μm (such as 0.55 μm to 0.8 μm, 1.0 μm to 1.5 μm, or 2.0 μm to 2.9 μm). In some embodiments, the thickness T2 of the twin layer 14*b* of the nano-twinned metallic thin film 14 is 0.35 μm to 2.9 μm (for example, 0.4 μm to 2.7 μm, 0.7 μm to 2.4 μm, 1 μm to 2.1 μm, 1.3 μm to 1.9 μm, or 1.6 μm to 1.7 μm). In some embodiments, the twin layer 14*b* of the nano-twinned metallic thin film 14 has parallel-arranged high-density twin boundaries, wherein the average distance between the parallel-arranged twin boundaries is 5 nm to 50 nm (such as 10 nm to 40 nm, 15 nm to 35 nm, or 20 nm to 30 nm). The parallel-arranged twin boundaries include no less than 50% (such as 51% to 99%, 56% to 94%, 61% to 89%, 66% to 84%, or 71% to 79%) of (111) crystal orientation. In some embodiments, the thickness T2 of the twin layer 14*b* is greater than 70% (such as 71%-99%, 74%-96%, 77%-93%, 80%-90%, or 83%-87%) of the thickness T1 of the nano-twinned metallic thin film 14, that is, the thickness of the transition layer 14*a* with disordered grains is less than 30% (such as 1%-29%, 4%-26%, 7%-23%, 10%-20%, or 13%-17%) of the thickness T1 of the nano-twinned metallic thin film 14.

The nano-twinned metallic thin film 14 formed by the method of the present disclosure includes silver, copper, gold, palladium or nickel. In some embodiments, the thickness of the transition layer 14*a* in the silver nano-twinned metallic thin film 14 is lower than about 8% (for example, 1.2%-7.2%, 2.7%-6.7%, 3.2%-6.2%, or 3.7%-5.2%) of the thickness T1 of the silver nano-twinned metallic thin film 14. In some embodiments, when the thickness T1 of the silver nano-twinned metallic thin film 14 is only about 0.7 μm (for example, 0.5 μm-1 μm or 0.6-0.9 μm), the thickness of the disordered grain transition layer 14*a* in its cross section is lower than 0.05 μm (for example 0.01 μm-0.04 or 0.02 μm-0.03 μm). When the thickness T1 of the silver nano-twinned metallic thin film 14 is about 1.5 μm (for example, 1.2 μm-1.8 μm, 1.3 μm-1.7 μm, or 1.4 μm-1.6 μm), the thickness of the transition layer 14*a* with disordered grain in its cross section is also less than 0.1 μm (for example, 0.01 μm-0.09 μm-0.03 μm-0.07 or 0.04 μm-0.05 μm). The FIB images show that the above-mentioned films all include parallel-arranged twin boundaries, wherein the average distance between the parallel-arranged twin boundaries is 5 nm to 50 nm. EBSD images show that the parallel-arranged twin boundaries of the twin layer 14*b* of the above-mentioned silver nano-twinned metallic thin film 14 have more than 98% (such as 98.2%-99.8%, 98.4%-99.6%, 98.6%-99.2%, or 98.8%-99%) of (111) preferred crystal orientation.

In some embodiments, the thickness of the transition layer 14*a* in the copper nano-twinned metallic thin film 14 is lower than about 15% (such as 1%-14.5%, 2.5%-13%, 4%-11.5%, 5.5%-10%, or 7%-8.5%) of the thickness T1 of the copper nano-twinned metallic thin film 14. In some embodiments, when the thickness T1 of the copper nano-twinned metallic thin film 14 is about 0.7 μm (such as 0.5 μm-1.1 μm, 0.65 μm-0.95 or 0.75 μm-0.85 μm), the thickness of transition layer 14*a* with disordered grain in its cross section is less than 0.1 μm (for example, 0.01 μm-0.09 0.03 μm-0.07 μm-0.04 μm-0.05 μm), and the parallel-arranged twin boundaries of the upper twin layer 14*b* has more than 55% (for example, 56%-99%, 61%-94%, 66%-89%, or 71%-84%) of (111) preferred crystal orientation.

In some embodiments, the thickness of the transition layer 14*a* in the gold nano-twinned metallic thin film 14 is lower than about 15% (such as 1%-14%, 3%-12%, 5%-10%, or 7%-9%) of the thickness T1 of the gold nano-twinned metallic thin film 14. In some embodiments, when the thickness T1 of the gold nano-twinned metallic thin film 14 is about 1.0 μm (such as 0.7 μm-1.3 μm, 0.8 μm-1.2 μm, or 0.9 μm-1.1 μm), the thickness of transition layer 14*a* with disordered grain in its cross section is less than 0.15 μm (for example, 0.01 μm-0.1 μm, 0.03 μm-0.09 μm, or 0.06 μm-0.07 μm), and the parallel-arranged twin boundaries of the upper twin layer 14*b* has no less than 60% (for example, 63%-99%, 67%-93%, 71%-89%, 75%-84%, or 79%-81%) of (111) preferred crystal orientation.

In some embodiments, the thickness of the transition layer 14*a* in the palladium nano-twinned metallic thin film 14 is lower than about 20% (such as 1%-17%, 4%-14%, 7%-11%, or 8%-9%) of the thickness T1 of the palladium nano-twinned metallic thin film 14. In some embodiments, when the thickness T1 of the palladium nano-twinned metallic thin film 14 is about 1.0 μm (such as 0.7 μm-1.3 μm, 0.8 μm-1.2 μm, or 0.9 μm-1.1 μm), the thickness of transition layer 14*a* with disordered grain in its cross section is less than 0.2 μm (for example, 0.01 μm-0.15 μm, 0.03 μm-0.12 μm, 0.05 μm-0.1 μm, 0.07 μm-0.08 μm), and the parallel-arranged twin boundaries of the upper twin layer 14*b* has no less than 58% (for example, 60%-99%, 64%-93%, 68%-89%, 72%-84%, 76%-81%) of (111) preferred crystal orientation.

In some embodiments, the thickness of the transition layer 14*a* in the nickel nano-twinned metallic thin film 14 is lower than about 15% (such as 1%-14.5%, 2.5%-13%, 4%-11.5%, or 7%-8.5%) of the thickness T1 of the nickel nano-twinned metallic thin film 14. In some embodiments, when the thickness T1 of the nickel nano-twinned metallic thin film 14 is about 2.0 μm (such as 1.7 μm-2.3 μm, 1.8 μm-2.2 μm, or 1.9 μm-2.1 μm), the thickness of transition layer 14*a* with disordered grain in its cross section is less than 0.3 μm (for example, 0.01 μm-0.25 μm, 0.03 μm-0.2 μm, 0.05 μm-0.15 μm, or 0.07 μm-0.1 μm), and the parallel-arranged twin boundaries of the upper twin layer 14*b* has no less than 50% (for example, 53%-98%, 58%-93%, 63%-88%, or 78%-83%) of (111) preferred crystal orientation.

Figure 3A:
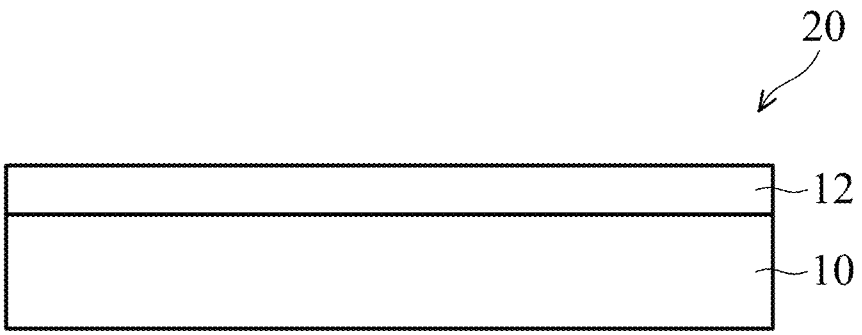
FIGS. 3A-3B show the schematic diagrams of the nano-twinned ultra-thin metallic film structure in various process stages, respectively, according to other embodiments of the present disclosure.
Figure 3B:
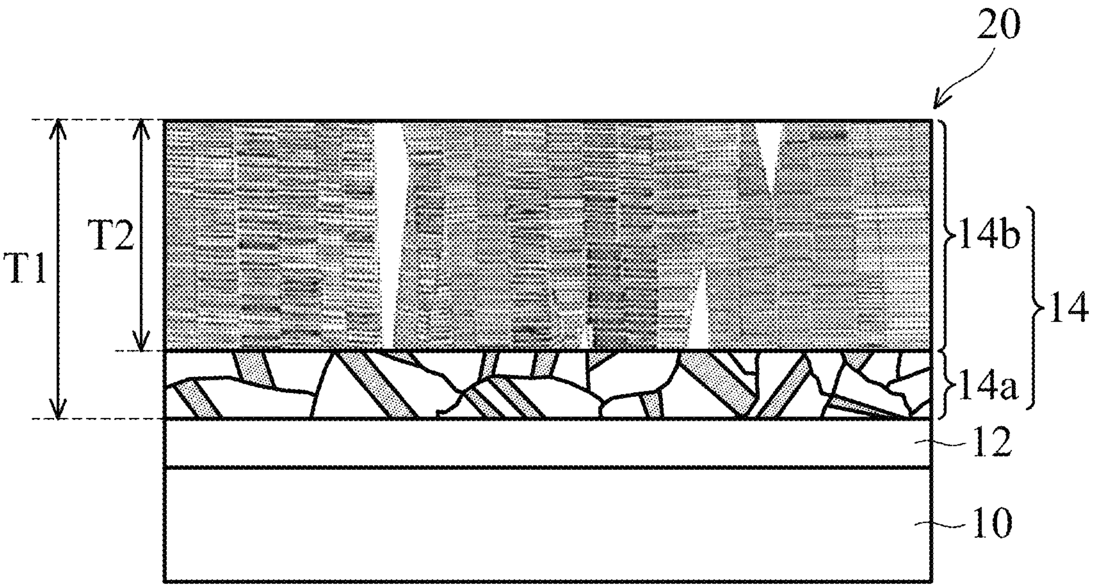

FIGS. 3A-3B show the schematic diagrams of the nano-twinned ultra-thin metallic film structure in various process stages respectively according to other embodiments of the present disclosure. FIG. 3A follows FIG. 2A and shows an adhesive layer 12 is formed on the surface of the activated substrate 10. The adhesive layer 12 provides better bonding force between the substrate 10 and the nano-twinned metallic thin film 14, and it also has the effect of lattice buffering.

In some embodiments, the adhesive layer 12 may include titanium, chromium, aluminum, or a combination thereof. In some embodiments, the adhesive layer 12 has a thickness of 0.01 μm to 1 μm, such as 0.005 μm to 0.5 μm, or 0.01 μm to 0.1 μm. In some embodiments, the thickness of the titanium-containing adhesive layer 12 may be 0.01 μm to 0.1 μm, such as 0.1 μm to 0.05 μm. In some embodiments, the thickness of the chromium-containing adhesive layer 12 may be 0.05 μm to 1 μm, for example, 0.1 μm to 0.5 μm. In some embodiments, the thickness of the aluminum-containing adhesive layer 12 may be 0.1 μm to 1 μm, such as 0.1 μm to 0.5 μm. It should be understood that, the thickness of the adhesive layer 12 can be properly adjusted according to practical applications, and the present disclosure is not limited thereto. The adhesive layer 12 may be formed on the substrate 10 by conventional sputtering, evaporation or electroplating, which is not limited thereto.

In some embodiments, the sputtering of the adhesive layer 12 adopts single-gun sputtering or multi-gun co-sputtering. In the sputtering process, the power source may use, for example, DC, DC plus, RF, or high-power impulse magnetron sputtering (HIPIMS). The sputtering power of the adhesive layer 12 may be, for example, about 100 W to about 500 W. The temperature of the sputtering process is room temperature, but the temperature will rise by about 50° C. to about 200° C. during the sputtering process. The background pressure of the sputtering process is about $1\times10^{-5}$ Torr to $5\times10^{-5}$ Torr. The working pressure may be, for example, about $1\times10^{-3}$ Torr to about $1\times10^{-2}$ Torr. The flow rate of argon is about 10 sccm to about 20 sccm. The rotation speed of the holder may be, for example, about 5 rpm to about 20 rpm. The deposition rate of the adhesive layer 12 may be, for example, about 0.5 nm/s to about 3 nm/s. It should be understood that, the parameters of the sputtering process described above may be appropriately adjusted according to practical applications, and the present disclosure is not limited thereto.

In some embodiments, the background pressure of the evaporation process of the adhesive layer 12 is about $1\times10^{-5}$ Torr to $5\times10^{-5}$ Torr. The working pressure may be, for example, about $1\times10^{-4}$ Torr to about $5\times10^{-4}$ Torr. The flow rate of argon is about 2 sccm to about 10 sccm. The rotation speed of the holder may be, for example, about 5 rpm to about 20 rpm. The deposition rate of the adhesive layer 12 may be, for example, about 1 nm/s to about 5.0 nm/s. It should be understood that, the parameters of the evaporation process described above may be appropriately adjusted according to practical applications, and the present disclosure is not limited thereto.

Referring to FIG. 3B, while the thin film is being sputtered, a negative bias is applied to the substrate 10 to attract argon ions to bombard the sputtered thin film to form a nano-twinned metallic thin film 14 on the adhesive layer 12. The formation method and structure of the nano-twinned metallic thin film 14 can refer to the embodiment shown in FIG. 2B and will not be repeated here. Since the adhesive layer 12 provides a better bonding force between the substrate 10 and the nano-twinned metallic thin film 14 and has the effect of lattice buffering, the thickness ratio of the twin layer 14*b* in the nano-twinned metallic thin film 14 can be increased by, such as, more than 5% (such as 6%-50%, 10%-46%, 14%-42%, 18%-38%, 22%-34%, or 26%-30%).

Figure 4A:
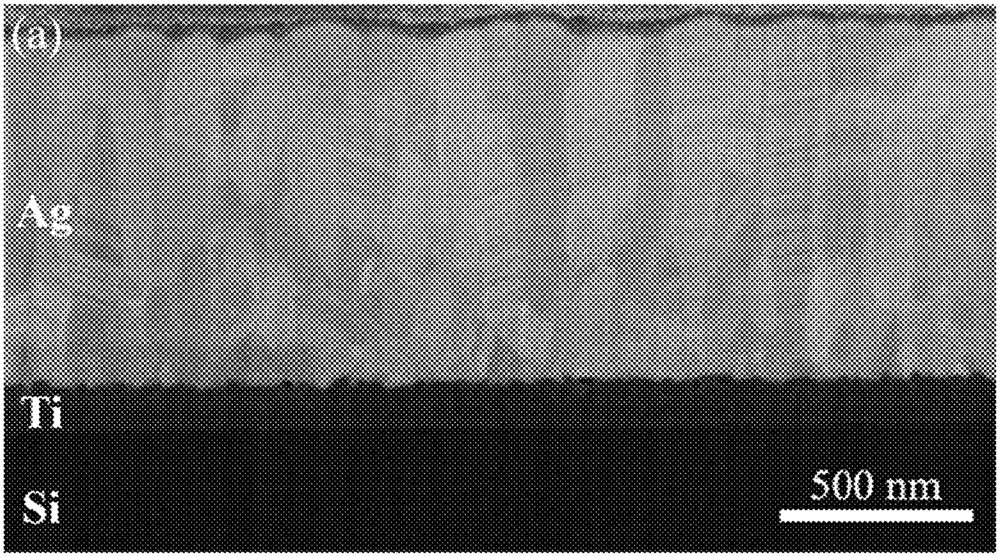
FIGS. 4A-4B show the focused ion beam (FIB) images of the cross section of the high-density silver nano-twinned thin film formed on the Si single crystal substrate activated by ion-beam bombardment, which respectively have a thickness of 0.7 μm and 1.5 μm, according to some embodiments.
Figure 4B:
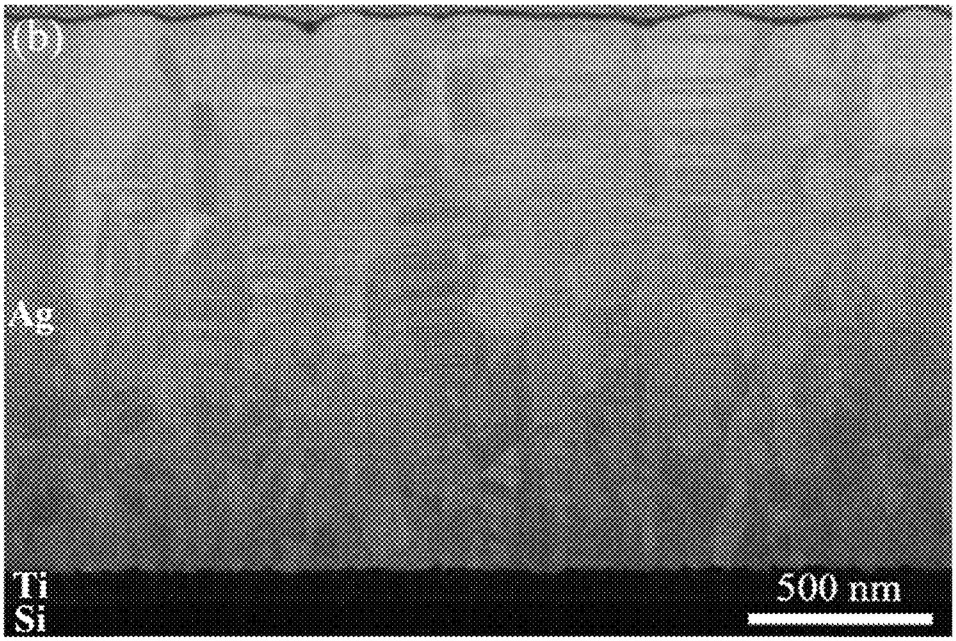

FIGS. 4A-4B show the focused ion beam (FIB) images of the cross section of the high-density silver nano-twinned thin film formed on the Si single crystal substrate activated by the ion-beam bombardment with a thickness of 0.7 μm and 1.5 μm, respectively, according to some embodiments. Wherein FIG. 4A shows that the cross section of silver nano-twinned metallic thin film almost forms an entire twin layer without a transition layer of disordered grains, and FIG. 4B shows that the thickness of the twin layer of the cross section of silver nano-twinned metallic thin film is 1.35 μm, that is, there is only a very small amount of disordered grain transition layer of about 0.15 μm. In addition, it can be measured by electron backscattered diffraction (EBSD) that the parallel-arranged twin boundaries in the 0.7 μm silver thin film of FIG. 4A has 71.4% of (111) preferred crystal orientation, and the parallel-arranged twin boundaries in the 1.5 μm silver thin film in FIG. 4B has 93.2% of (111) preferred crystal orientation.

Figure 5:
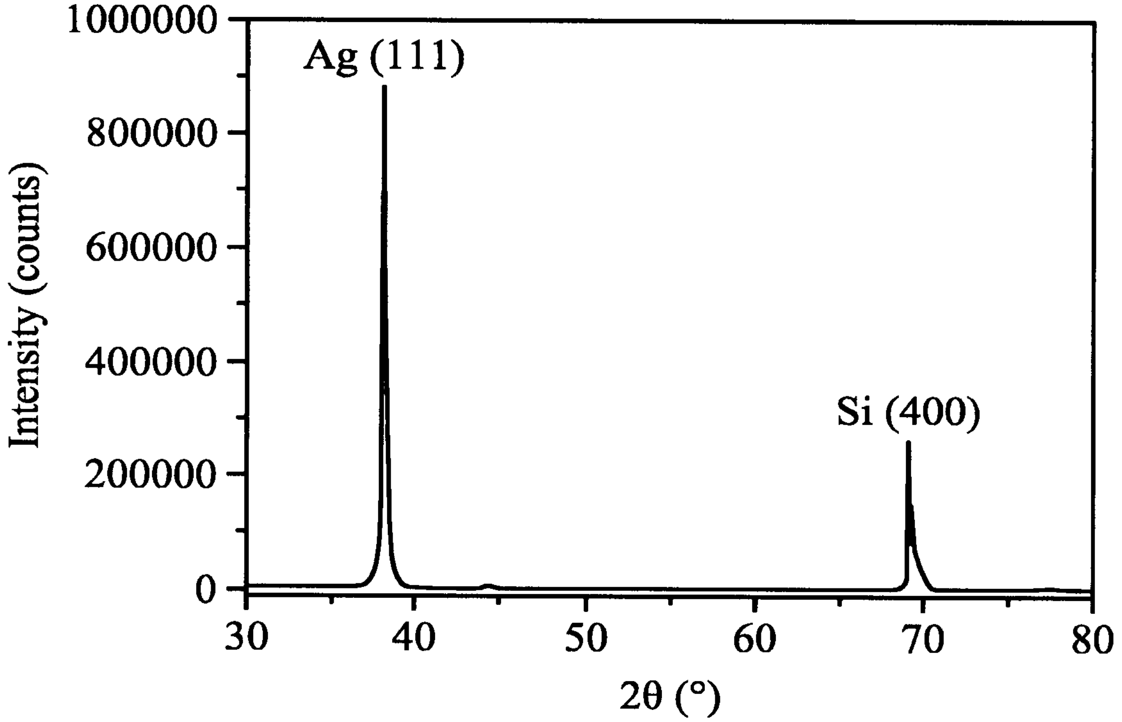
FIG. 5 shows the X-ray diffraction (XRD) image of the embodiment of FIG. 4A.

FIG. 5 is an X-ray diffraction (XRD) image of the embodiment of FIG. 4A, which shows that the silver thin film with a thickness of 0.7 μm has a strong signal of (111) preferred crystal orientation. Because the thickness of the silver film is only 0.7 μm, the XRD signal of the silicon (Si) single crystal substrate still appears.

Figure 6:
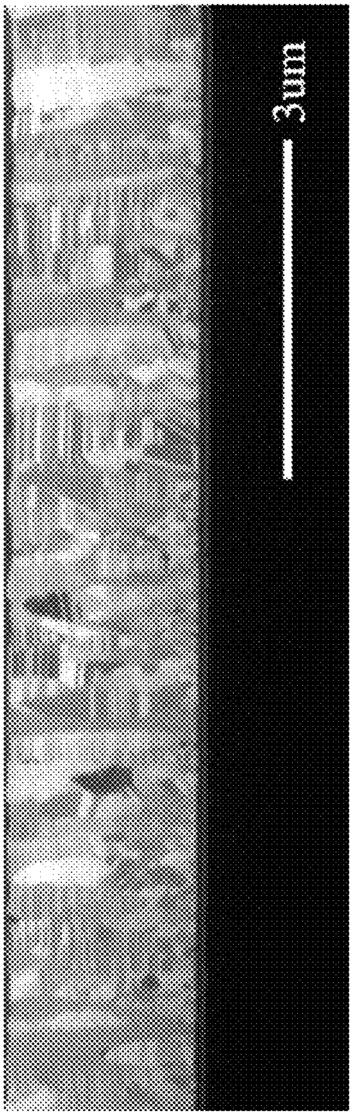
FIG. 6 shows the focused ion beam (FIB) image of the cross section of the high-density cooper nano-twinned thin film formed on the Si single crystal substrate activated by ion-beam bombardment with a thickness of 1.5 μm, according to some embodiments.

FIG. 6 shows the focused ion beam (FIB) image of the cross section of the high-density cooper nano-twinned thin film directly formed on the Si single crystal substrate activated by the ion-beam bombardment with a thickness of 1.5 μm, without forming the adhesive layer, according to some embodiments. The thickness of the twin layer in the cross-section is 1.32 μm, that is, there is only a very small amount of disordered grain transition layer of about 0.18 μm. In addition, it can be measured by EBSD that the parallel-arranged twin boundaries in the nano-twinned metallic thin film of the embodiment in FIG. 6 have more than 91.3% of (111) preferred crystal orientation.

Figure 7:
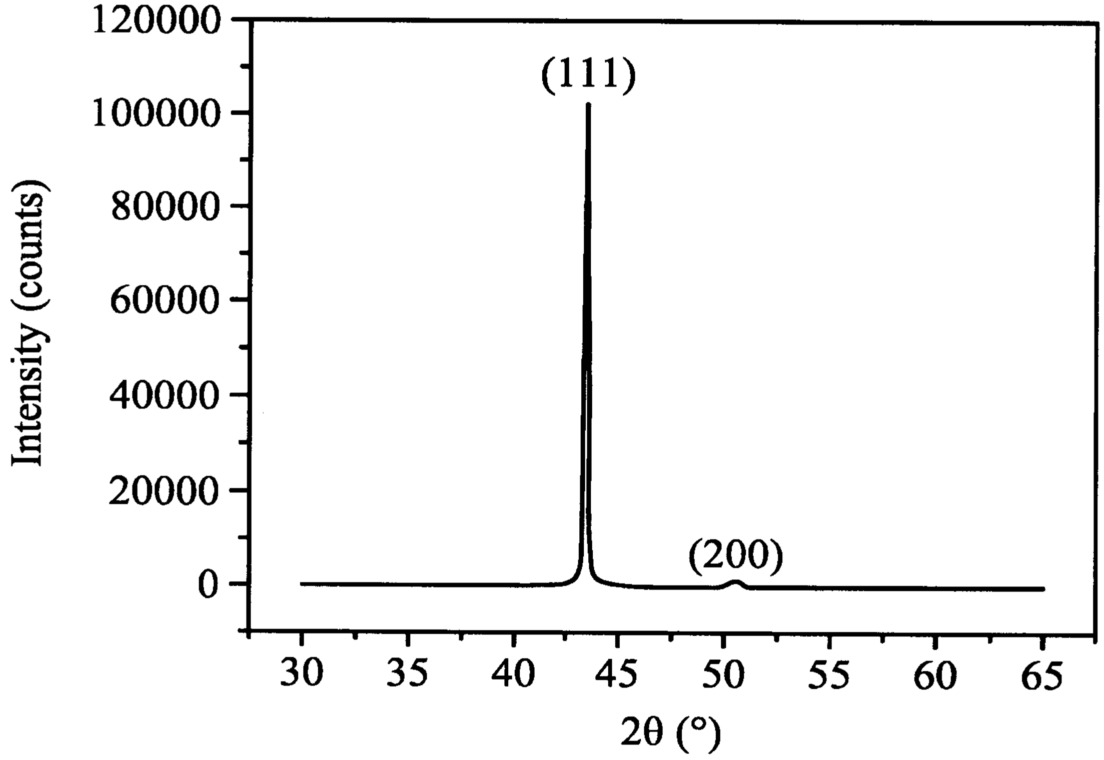
FIG. 7 shows the X-ray diffraction (XRD) image of the embodiment of FIG. 6.

FIG. 7 is an X-ray diffraction (XRD) image of the embodiment of FIG. 6, which shows that the copper nano-twinned thin film with a thickness of 1.5 μm has a strong signal of (111) preferred crystal orientation and a weak signal of (200) crystal orientation.

Figure 8A:
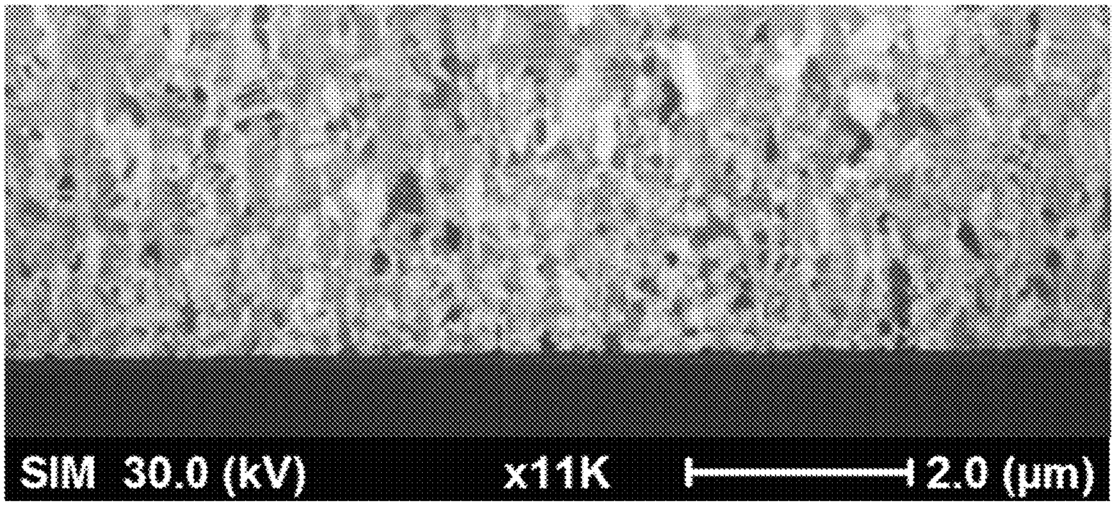
FIGS. 8A-8E show the focused ion beam (FIB) images of the cross section of the cooper nano-twinned thin films what have a thickness of 3.0 μm formed on the SiC single crystal substrate by applying different voltages while sputtering, according to some embodiments, wherein the substrate is first activated by ion-beam bombardment.
Figure 8B:
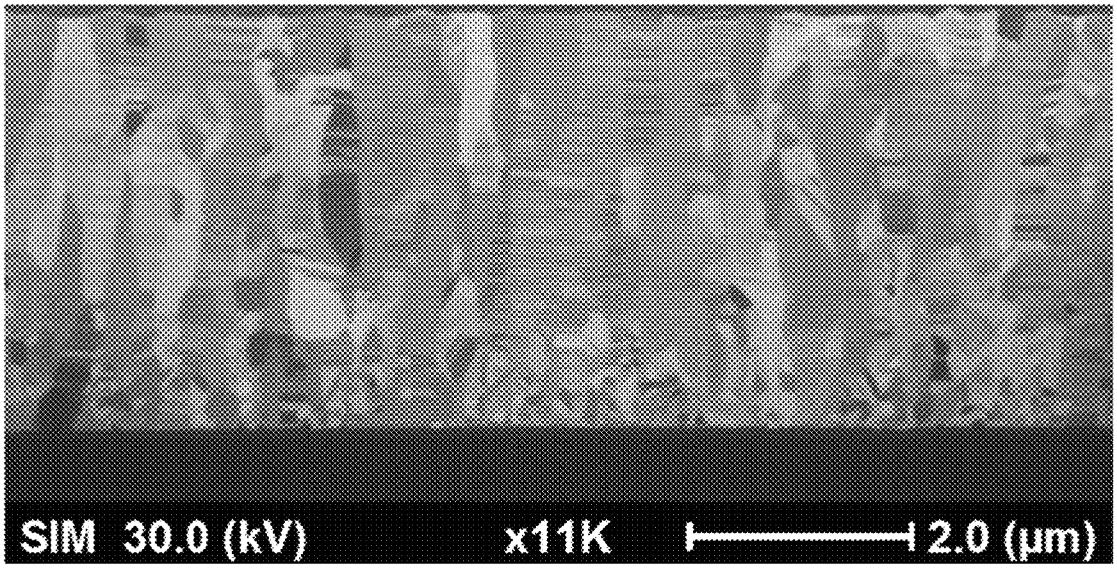
Figure 8C:
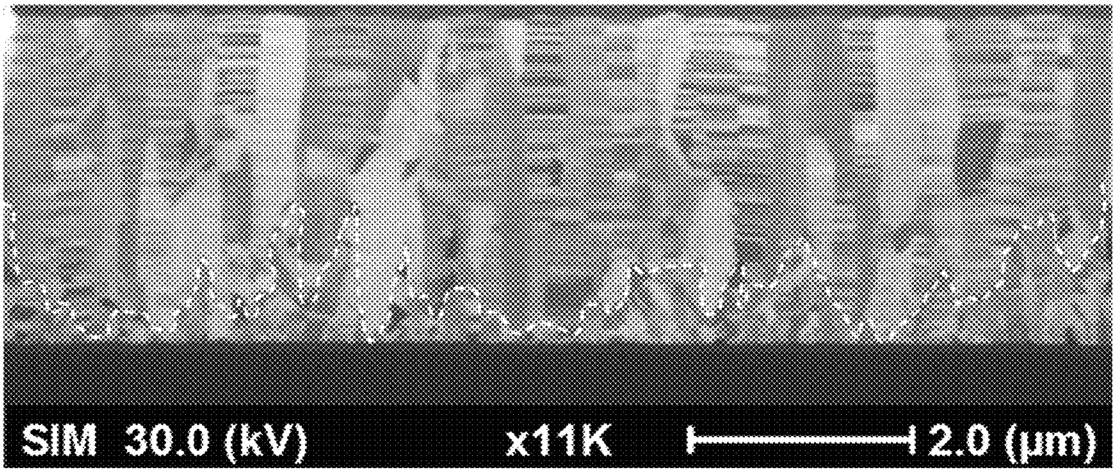
Figure 8D:
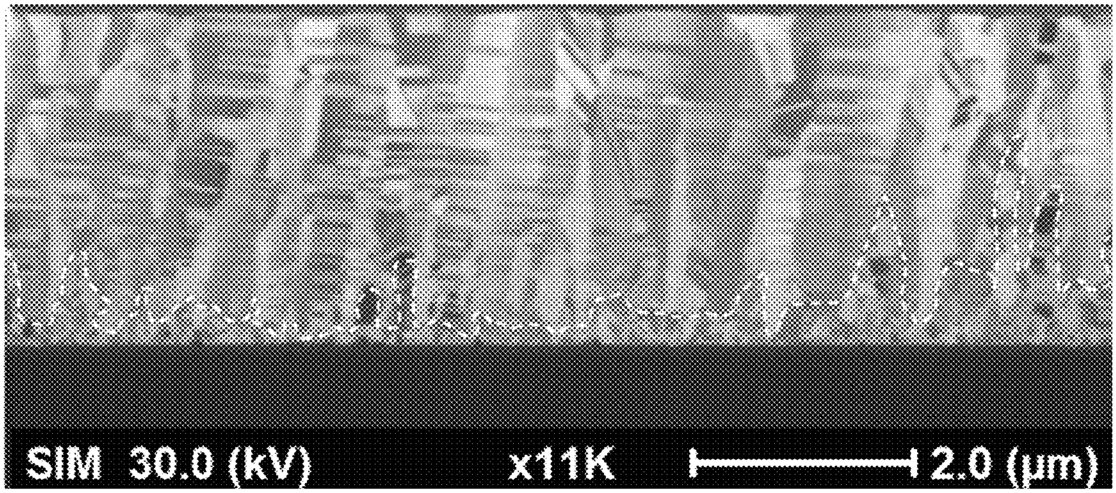
Figure 8E:
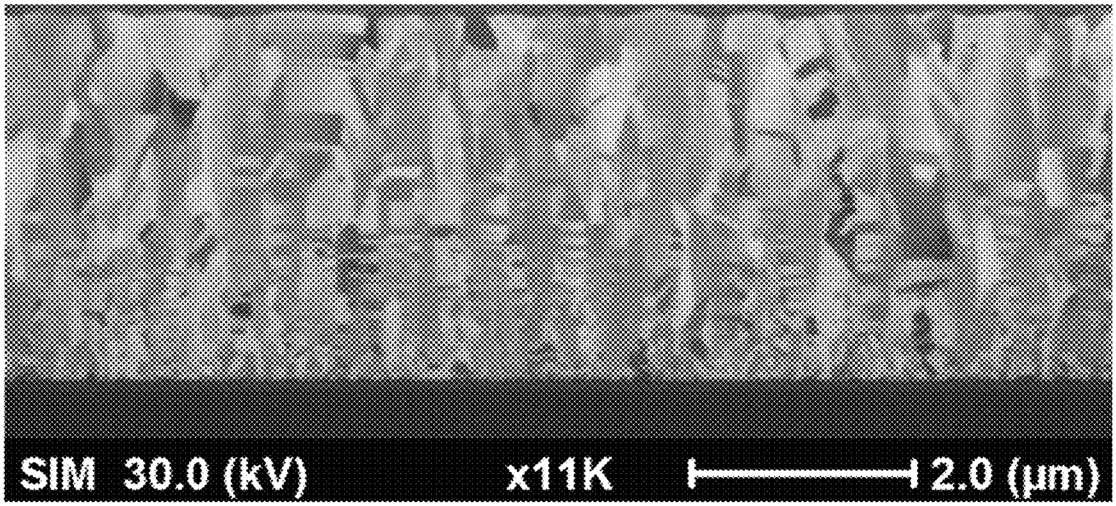

FIGS. 8A-8E show the focused ion beam (FIB) images of the cross section of the cooper nano-twinned thin film with a thickness of 3.0 μm formed on the SiC single crystal substrate after forming 0.1 μm titanium adhesive layer by sputtering with different voltages applied, according to some embodiments, wherein the substrate is first activated by the −500V ion-beam bombardment. FIG. 8A shows a thin film formed by sputtering while applying a voltage of −50V to the substrate, wherein the thickness of the twin layer in the thin film represents about 10% of the thickness of the thin film, and the average distance between the twin boundaries is about 30 nm. FIG. 8B shows a thin film formed by sputtering while applying a voltage of −100V to the substrate, wherein the thickness of the twin layer in the thin film greatly increased, until it represents about 80% of the thickness of the thin film, and the average distance between the twin boundaries is about 15 nm. FIG. 8C shows a thin film formed by sputtering while applying a voltage of −150V to the substrate, wherein the thickness of the twin layer in the thin film continues to increase, reaching about 95% of the thickness of the film, but the average distance between the twin boundaries increases to about 20 nm. FIG. 8D shows a thin film formed by sputtering while applying a voltage of −200V to the substrate, wherein the thickness of the twin layer in the thin film is maintained at a level wherein it represents about 95% of the thickness of the thin film, but the average distance between the twin boundaries increases to about 30 nm. FIG. 8E shows a thin film formed by sputtering while applying a voltage of −250V to the substrate, wherein the thickness of the twin layer in the thin film represents about 90% of the thickness of the film, but the average distance between the twin boundaries greatly increased to about 60 nm. The FIB images of FIGS. 8A-8E show that when a bias voltage of −150V to −200V is applied to the substrate, there are nano-twinned structures in more than 95% of the thickness of the sputtered copper thin film, and the average distance between the twin boundaries is less than 30 nm. FIGS. 8A-8E demonstrate that by conducting a ion-beam bombardment before sputtering and applying a bias voltage during sputtering on the substrate, a high-quality ultra-thin copper nano-twinned coatings can be obtained on the surface of SiC wafers.

Figure 9:
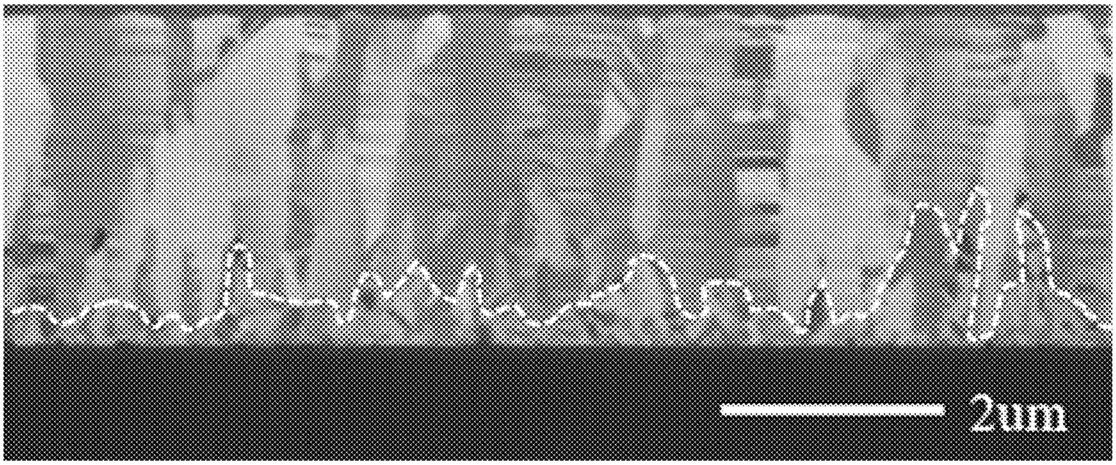
FIG. 9 shows the focused ion beam (FIB) image of the cross section of the cooper nano-twinned thin film with a thickness of 3.0 μm formed on the SiC single crystal substrate activated by ion-beam bombardment, according to some embodiments.

FIG. 9 shows the focused ion beam (FIB) image of the cross section of the cooper nano-twinned thin film with a thickness of 3.0 μm directly formed on the SiC single crystal substrate activated by the ion-beam bombardment, according to some embodiments. The thickness of the twin layer in the film represents more than 90% of the thickness of the thin film, and the average distance between the twin boundaries is about 15 nm. Also, it can be measured by EBSD that the parallel-arranged twin boundaries in copper nano-twinned films have more than 94.1% (111) preferred crystal orientation.

From the above experimental results, it can be seen that the nano-twinned metallic thin film can be formed on different substrates by the specific formation method of the present disclosure. When the thickness of the nano-twinned metallic thin film is 3 μm-1.5 μm, it can include no less than 90% of (111) preferred crystal orientation, and when the thickness of the nano-twinned metallic thin film is less than 1 it can still include no less than 70% of (111) preferred crystal orientation. To sum up, in the present disclosure, the substrate is activated using ion beam bombardment, so that the metallic film formed on the substrate can obtain additional energy, thereby forming an ultra-thin nano-twinned metallic thin film. It is known that in any nano-twinned film with a thickness less than 3 μm formed by the method used in the prior art, no less than 30%, and as much as 50%, of the thickness of the metal film will have a disordered crystal region. That is, metallic thin films that are less than 3 μm thick but have a high-density twin layer that represents more than 70% of the thickness of metallic thin film, as provided in the present disclosure, cannot be obtained using the prior art.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A nano-twinned ultra-thin metallic film structure, comprising:

a substrate, wherein the substrate is a bare wafer substrate; and a nano-twinned metallic ultra-thin film formed directly on a surface of the substrate, wherein a thickness of the nano-twinned metallic ultra-thin film is 0.5 μm to 3 μm, the nano-twinned metallic ultra-thin film comprises a transition layer near the substrate and a twin layer away from the substrate, the twin layer accounts for at least 70% of a thickness of the nano-twinned metallic ultra-thin film and comprises parallel-arranged twin boundaries, and the parallel-arranged twin boundaries comprise no less than 50% of (111) crystal orientation, wherein the nano-twinned metallic ultra-thin film comprises silver, copper, gold, palladium, or nickel.

2. The structure as claimed in claim 1, wherein an average distance between the parallel-arranged twin boundaries is 5 nm to 50 nm.

3. The structure as claimed in claim 1, wherein a plurality of integrated circuit devices are formed on the surface of the substrate.

4. The structure as claimed in claim 1, wherein the substrate comprises a silicon substrate, a silicon carbide substrate, a gallium arsenide substrate, a sapphire substrate, or a glass substrate.

5. A method of forming the nano-twinned ultra-thin metallic film structure as set forth in claim 1, comprising:

activating the surface of the substrate using ion beam bombardment; and forming the nano-twinned metallic ultra-thin film on the activated surface of the substrate.

6. The method as claimed in claim 5, wherein the ion-beam bombardment in the activating the surface of the substrate uses an argon ion beam or an oxygen ion beam.

7. The method as claimed in claim 5, wherein the ion-beam bombardment in the activating the surface of the substrate comprises a power of 20 W to 100 W, a voltage of −200V to −800V, and a duration of 10 minutes to 60 minutes.

8. The method as claimed in claim 5, wherein the nano-twinned metallic ultra-thin film is formed by sputtering.

9. The method as claimed in claim 8, further comprising: applying a bias voltage of −100V to −500V to the substrate during the sputtering.

10. The method as claimed in claim 5, wherein a plurality of integrated circuit devices are formed on the surface of the substrate.

11. The method as claimed in claim 5, wherein the substrate comprises a silicon substrate, a silicon carbide substrate, a gallium arsenide substrate, a sapphire substrate, or a glass substrate.

* * * * *